(12) United States Patent
Cohen et al.

(10) Patent No.: US 12,484,235 B2
(45) Date of Patent: Nov. 25, 2025

(54) SOLID-STATE SWITCH

(71) Applicant: International Business Machines Corporation, Armonk, NY (US)

(72) Inventors: Guy M. Cohen, Ossining, NY (US); Takashi Ando, Eastchester, NY (US); Nanbo Gong, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 744 days.

(21) Appl. No.: 17/693,340

(22) Filed: Mar. 12, 2022

(65) Prior Publication Data
US 2023/0320105 A1  Oct. 5, 2023

(51) Int. Cl.
*H10B 63/00* (2023.01)
*H10N 70/00* (2023.01)
*H10N 70/20* (2023.01)

(52) U.S. Cl.
CPC ........... *H10B 63/84* (2023.02); *H10N 70/011* (2023.02); *H10N 70/231* (2023.02); *H10N 70/826* (2023.02); *H10N 70/8413* (2023.02)

(58) Field of Classification Search
CPC .............................. H10B 63/00; H10B 70/00
See application file for complete search history.

(56) References Cited

U.S. PATENT DOCUMENTS

| | | |
|---|---|---|
| 9,362,492 B2 | 6/2016 | Goktepeli |
| 9,368,720 B1 | 6/2016 | Moon |
| 9,917,104 B1 | 3/2018 | Roizin |

FOREIGN PATENT DOCUMENTS

JP  2005123375 A  5/2005

OTHER PUBLICATIONS

"Complementary Switching in Oxide-Based Bipolar Resistive-Switching Random Memory", IEEE Transactions on Electron Devices, vol. 60, No. 8 pp. 1, Jan. 2013.
Amin et al., "Wideband SPDT and SP4T RF Switches using Phase-Change Material in a SiGe BiCMOS Process," 2021 IEEE MTT-S International Microwave Symposium (IMS), 2021, We3D-4, pp. 431-434, doi: 10.1109/IMS19712.2021.9574962.
Hatayama et al., "Inverse Resistance Change Cr2Ge2Te6-Based PCRAM Enabling Ultralow-Energy Amorphization," ACS Appl. Mater. Interfaces 2018, 10, 3, 2725-2734, Publication Date:Dec. 27, 2017, <https://doi.org/10.1021/acsami.7b16755>.

(Continued)

*Primary Examiner* — Marvin Payen
(74) *Attorney, Agent, or Firm* — David K. Mattheis

(57) ABSTRACT

A solid-state switch structure including a first solid-state material having a programable electrical resistance comprising a high electrical resistance obtained following a first type programming pulse and a low electrical resistance obtained following a second type programming pulse, a second solid-state material having a programable electrical resistance comprising a high electrical resistance obtained following said second type programming pulse and a low electrical resistance obtained following said first type programming pulse, a first contact made to a first end of said first solid-state material, a second contact made to a first end of said second solid-state material, a third contact made to a second end of said first solid-state material and to a second end of said second solid-state material.

20 Claims, 18 Drawing Sheets

(56) References Cited

OTHER PUBLICATIONS

Shuang et al., "Contact resistance change memory using N-doped $Cr_2Ge_2Te_6$ phase-change material showing non-bulk resistance change," 6 pps., Appl. Phys. Lett. 112, 183504 (2018), <https://doi.org/10.1063/1.5029327>.

Singh et al., "Scalable Non-Volatile Chalcogenide Phase Change GeTe-Based Monolithically Integrated mmWave Crossbar Switch Matrix," 2021 IEEE MTT-S International Microwave Symposium (IMS), 2021, pp. 420-423, doi: 10.1109/IMS19712.2021.9574939.

Young et al., "Improvements in GeTe-based Phase Change RF Switches," 2018 IEEE/MTT-S International Microwave Symposium—IMS, 2018, pp. 832-835, doi: 10.1109/MWSYM.2018.8439212.

500

SOLID-STATE SWITCH

FIELD OF THE INVENTION

The disclosure relates generally to solid-state switches. The disclosure relates particularly to solid-state phase change material single pole double throw (SPDT) switches.

BACKGROUND

Phase change materials having varying electrical resistivities according to the physical state of the material, i.e. crystalline phase or amorphous phase, are known in the art. Methods for switching such materials from amorphous to crystalline and back are also known. Examples of method for switching the material includes optical switching using a laser pulse, and electrical switching using current pulses.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a solid-state switch structure including a first solid-state material having a programable electrical resistance comprising a high electrical resistance obtained following a first type programming pulse and a low electrical resistance obtained following a second type programming pulse, a second solid-state material having a programable electrical resistance comprising a high electrical resistance obtained following said second type programming pulse and a low electrical resistance obtained following said first type programming pulse, a first contact made to a first end of said first solid-state material, a second contact made to a first end of said second solid-state material, a third contact made to a second end of said first solid-state material and to a second end of said second solid-state material.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1A:
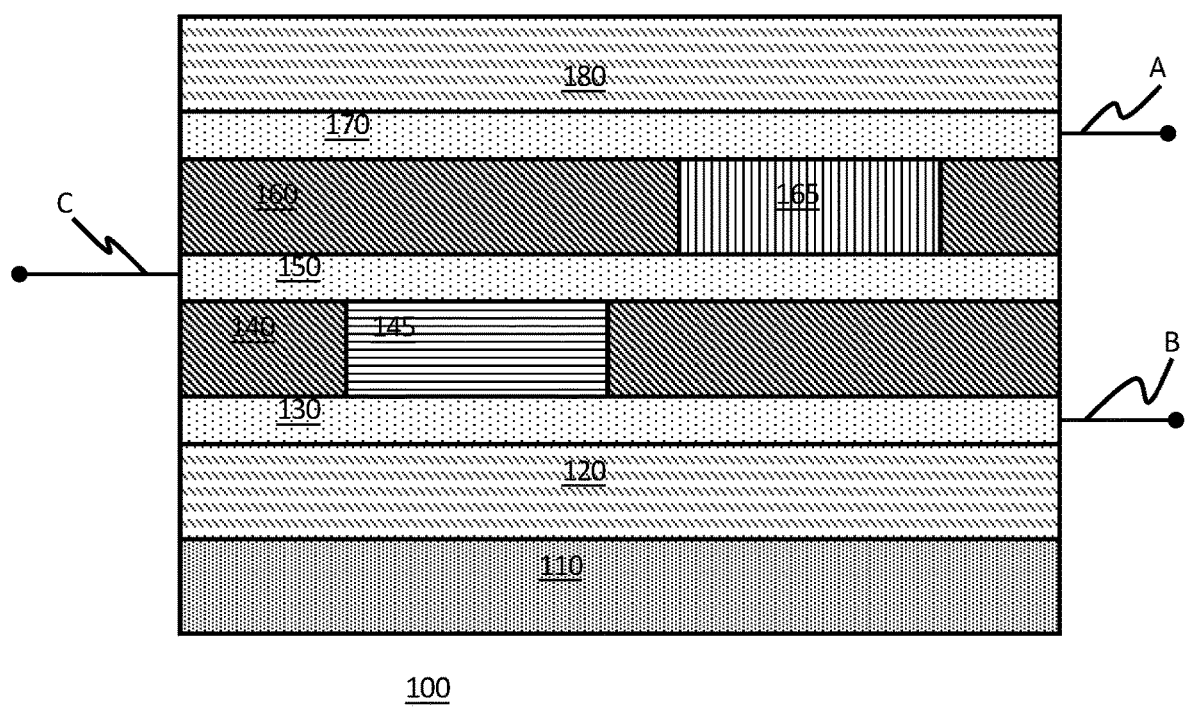
FIG. 1A provides a cross-sectional view of an embodiment of the invention.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is between 0 and 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes for the metal liner and sacrificial material include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

PCM material takes advantage of the large resistance contrast between the amorphous and crystalline states. For a material such as germanium antimony telluride, ($Ge_2Sb_2Te_5$, also abbreviated as GST). The amorphous phase has high electrical resistivity, and the crystalline phase has a low resistivity. For a material such as chromium germanium telluride, ($Cr_2Ge_2Te_6$ also abbreviated as CrGT) the amorphous phase has a low electrical resistivity compared to the crystalline phase of the material. Oftentimes the difference in resistivity is two to three orders of magnitude. The electrical resistivity of the PCM material may be altered by doping the material. For example, by adding nitrogen or oxygen to GST material the crystalline phase is made more resistive and the crystallization temperature of the PCM increases. Doping is of a particular interest in the case of CrGT as it can even reverse which of the phases are more resistive. The crystalline phase resistivity of undoped CrGT exceeds that of amorphous undoped CrGT, while the resistivity of amorphous CrGT, doped to include about 7.9% nitrogen (N-CrGT), exceeds the resistivity of crystalline 7.9% N-CrGT. Electronic devices that are using PCM material can exhibit a high resistance or a low resistance based on the phase of the PCM material. Thus, the change in state of device materials from amorphous to crystalline and back may be used to alter the circuitry of the device and to switch the path of the current within the device.

From an amorphous phase, the PCM material may be set to the crystalline phase by the application of sufficient current to raise the temperature of the PCM material above the threshold temperature necessary to crystalize the amorphous phase. The PCM material may then be reset by the application of sufficient current to raise the temperature of the PCM material above the melt temperature of the material. The molten material is then quenched by the rapid removal of the current. Quenching the PCM material results in the material returning to the amorphous glass phase.

Solid-state switches offer a means to support analog and binary computing devices as each switch has the capacity to store a programmed state. Solid-state switches lack moving parts and the associated issues of arcing or sticking contacts. Unlike transistors, such switches do not consume power to maintain their switched state. Configurations including cascading series of solid-state switches enable circuits having more than two outputs and may be used to construct logical decision trees associated with one or more inputs associated with a possible range of outputs.

In an embodiment, the stored state of each switch corresponds to the resistance of the phase change materials of the switch. The resistance varies according to the crystalline or amorphous structure of the materials. In an embodiment, formation of PCM switches occurs with the material in an amorphous state. Application of a lower level of voltage (the set voltage) over a relatively long duration causes the temperature of the amorphous material to exceed a crystallization temperature threshold, causing the material to crystalize, altering the state of the switch. Application of a short duration high voltage and current electrical pulse raises the temperature of the material beyond the melt temperature. This breaks down the crystalline structure of the material. The abrupt fall of the pulse results in a rapid temperature drop, quenching the melted portion of the material and leaving it in an amorphous state as there is insufficient time for the crystal lattice to form. Depending upon the particular materials selected, the output of the switch varies according to the state of the PCM, the switch has a first output associated with the materials in a crystalline state, and a second output associated with the materials in an amorphous state. Applying a voltage across the switch causes current to flow along the pathway associated with the state of the switch.

Reference is now made to the figures. The figures provide schematic cross-sectional illustration of semiconductor devices at intermediate stages of fabrication, according to one or more embodiments of the invention. The figures provide a cross-section view of devices at various stages of fabrication. The figures provide schematic representations of the devices of the invention and are not to be considered accurate or limiting with regards to device element scale.

In an embodiment illustrated in FIG. 1A, a solid-state switch 100 comprises a stack of functional layers disposed upon an underlying substrate or underlying device circuit components, collectively 110. (To simplify the following description, references to heater elements in the following description are considered to include the heater element structure described below with references to FIG. 2.) In this embodiment, the stack comprises a first heater element 120 disposed upon the underlying substrate and/or device circuits 110. A first conductive contact 130, such as tungsten or similar conducive materials, is disposed adjacent to the first heater element 120 and connected to electrical contact B. A first switching element, either a PCM or dielectric is then disposed adjacent to the first conductive contact. In the illustrated embodiment, deposition of a first layer of a dielectric 140, such as silicon nitride, above and adjacent to the conductive contact 130, followed by selective etching of a trench in the layer of ceramic, provides a defined location for the deposition of a first PCM 145, such as GST, CrGT, or similar PCMs. The first PCM 145 may be deposited in the defined location in either a crystalline or amorphous state. The stack continues with another conductive metal contact 150, such as tungsten or similar, above and adjacent to the first PCM 145 and the first dielectric layer 140, and connected to electrical contact C. Deposition and selective etching of a second dielectric layer 160, similar to the first dielectric layer 140, provides a defined location of a second PCM 165, such as CrGT, which differs from the first PCM. In an embodiment, the first and second PCMs, 145, 165, comprise CrGT having differing levels of nitrogen doping, yielding differing amorphous and crystalline resistivities for each of the two PCMs, 145, 165. In yet another embodiment the first and second PCMs, 145, 165, comprise CrGT and GST respectively. Deposition of PCM 145 and 165, in trenches etched in respective dielectric layers 140 and 160 enables the thermal switching of each PCM from amorphous to crystalline and back without the PCM flowing within the device in an unconstrained manner.

In this embodiment, deposition of a third conductive contact 170, such as tungsten or similar, above and adjacent to the second dielectric 160, second PCM 165, combination, and connected to electrical contact A, and fabrication of a second heater element 180, above and adjacent to the third conductive contact 170, completes the solid-state switch stack of this embodiment.

Figure 1B:
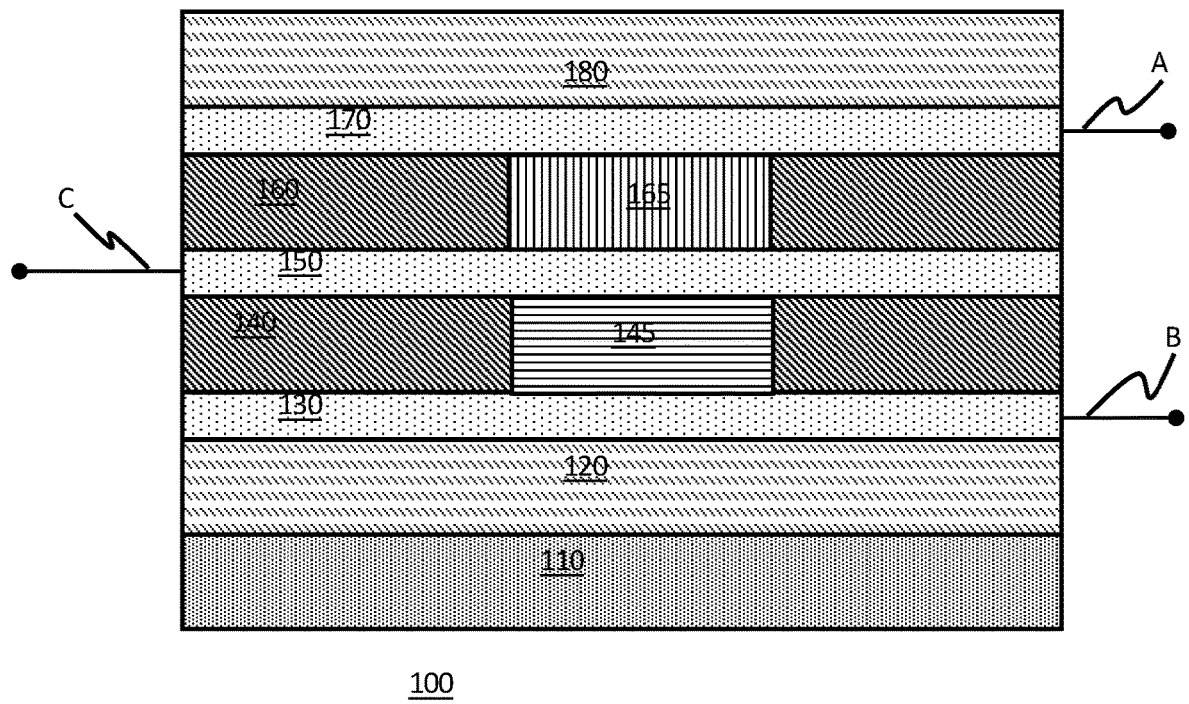
FIG. 1B provides a cross-sectional view of an embodiment of the invention.

FIG. 1B illustrates an embodiment wherein PCM 145 and PCM 165 are vertically aligned. In this embodiment, application of SET and RESET pulses to the combination of PCM 145 and PCM 165 require less energy due to synergistic PCM heating due to the vertical alignment of the PCM elements.

Figure 1C:
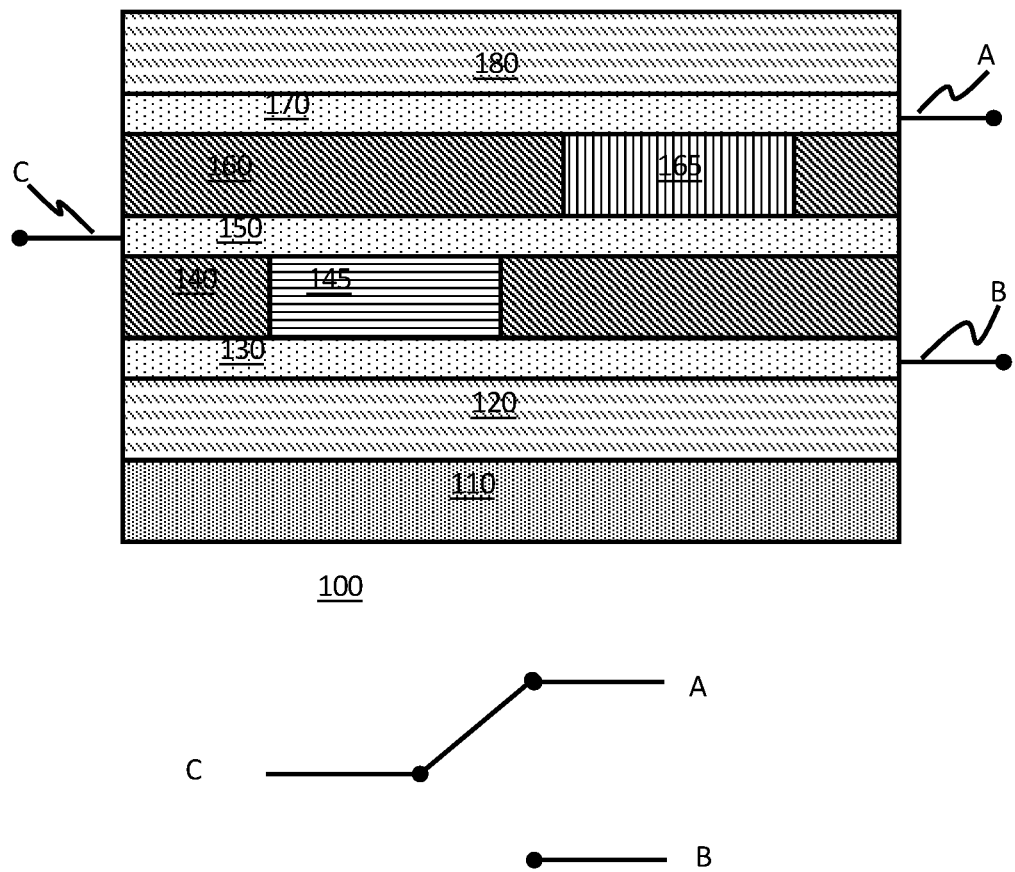
FIG. 1C provides a cross-sectional view of an embodiment of the invention.

FIG. 1C illustrates an SPDT switch having each of PCM 145 (e.g., GST) and 165 (e.g., CrGT) in an amorphous state and illustrating the low resistance connection between connection C and connection A.

Figure 1D:
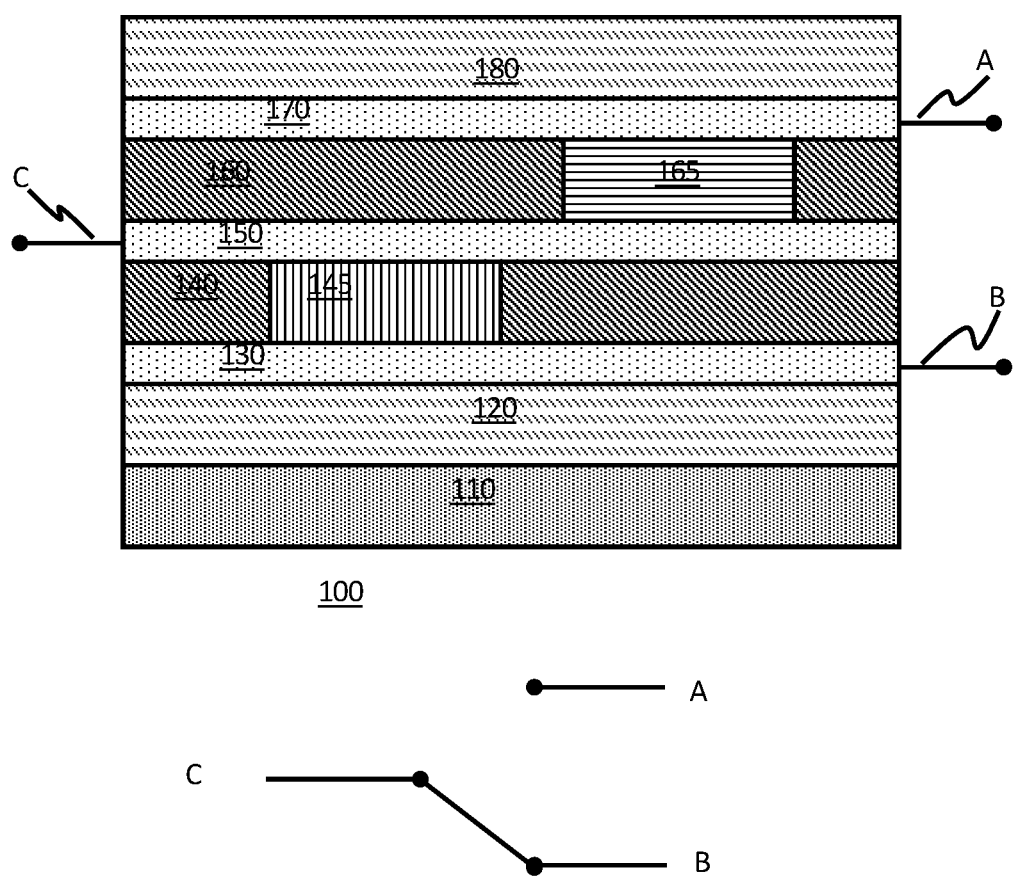
FIG. 1D provides a cross-sectional view of an embodiment of the invention.

FIG. 1D illustrates an SPDT switch having each of PCM 145 (e.g., GST) and 165 (e.g., CrGT) in crystalline state and illustrating the low resistance connection between connection C and connection B.

In an embodiment, individual contacts for each of the first heater 120, and second heater 180, may be disposed to enable individual activation of each heater and associated PCM. In an embodiment, the locations of the trenches with the first dielectric 140, and second dielectric 160, layers provide an opportunity to isolate the first PCM 145, from the respective thermal effects associated with the second heater element 180, and similarly, to isolate the second PCM 165, from the thermal effects associated with the first heater element 120. As shown in FIG. 1A, PCMs 145, and 165, are laterally offset from each other with respect to a vertical axis of the device. In contrast to a configuration wherein first PCM 145 and second PCM 165, are aligned each with the other with respect to a vertical axis, this offset enables the application of heat from second heater element 180, to second PCM 165, with less likelihood of a thermal affect upon first PCM 145, as well as the application of heat from first heater element 120, to first PCM 145, with less likelihood of an associated thermal effect upon PCM 165. In applications where both PCM 145 and PCM 165 need to switch simultaneously, heaters 120 and 180 may be electrically tied together and vertically aligning PCM 145 and PCM 165, as illustrated in FIG. 1B, may be beneficial as less energy need to be delivered by heaters 120 and 180 to achieve switching.

Figure 2:
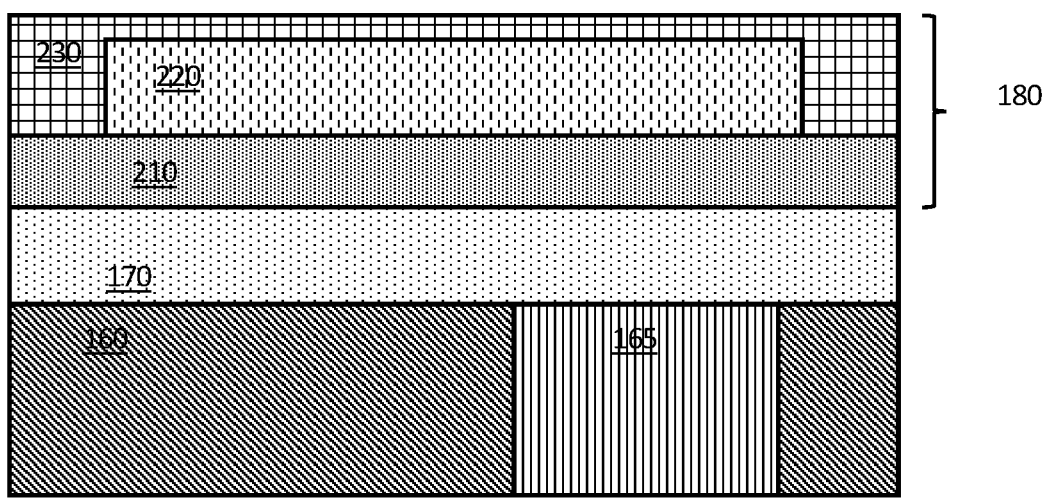
FIG. 2 provides a cross-sectional view of a resistive heater element disposed as a portion of an embodiment of the invention.

In an embodiment, the physical state of the PCM may be altered indirectly through the application of heat from a heating element to the PCM, rather than through the direct application of an electrical pulse to the PCM material. The use of such a proximity heater electrically isolates the heater from the PCM as well electrically isolate the heater from contacts A, B, and C. As shown in FIG. 2, the heater element 180, may be disposed adjacent to a device switch contact 170, from FIG. 1A, which is in turn disposed adjacent to a device PCM material 165, from FIG. 1A. In this embodiment, the heater element 180, comprises a thermally conductive but electrically insulating material 210, such as aluminum nitride (AlN), or boron nitride (BN), electrically isolating the switch contact 170, from a resistive heater element 220. The resistive heater element 220, may comprise of amorphous carbon doped with hydrogen, tantalum nitride, or similar materials, disposed adjacent to the thermally conductive electrically insulating material 210, and a thermal insulator 230, such as a low-k dielectric, disposed adjacent to the resistive heater to shield the rest of the device from the thermal energy of the resistive heater. In this embodiment, application of differing electrical pulses to the resistive heater 220, functions to alter the state of the PCM 165, as described above, from amorphous to crystalline and back to amorphous.

Figure 3A:
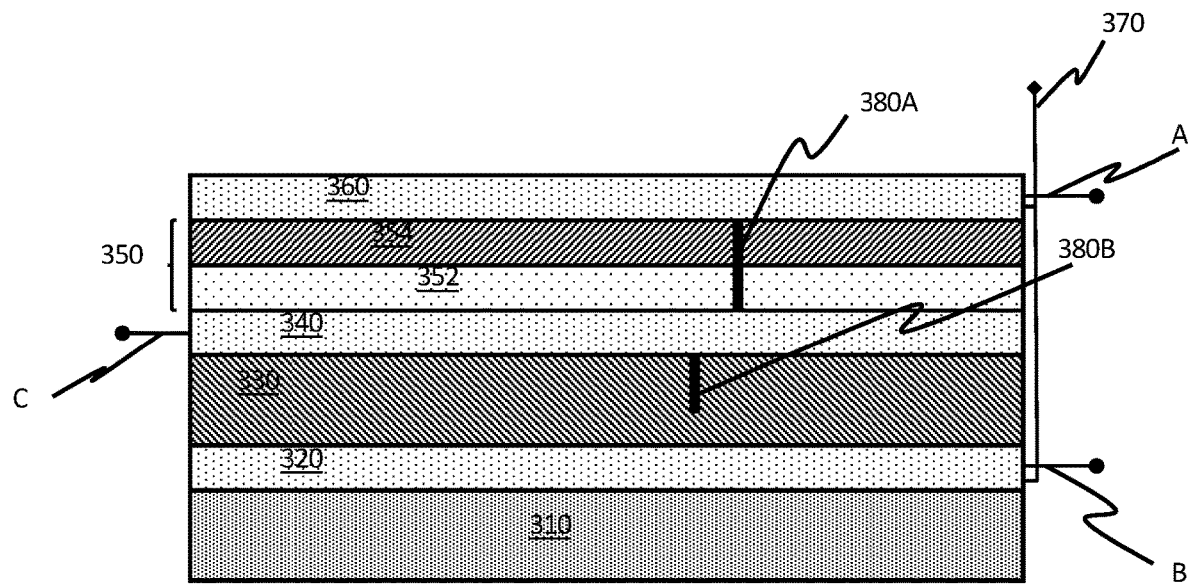
FIG. 3A provides a cross-sectional view of an embodiment of the invention.
Figure 3A:
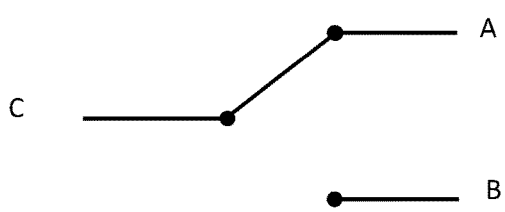

In an embodiment illustrated in FIG. 3A, the solid-state SPDT switch 300, disposed upon underlying substrate/circuits 310, comprises differing dielectric materials disposed between a set of three contacts. A first dielectric material 330, disposed between a first contact 320, and third contact 340, and a second dielectric material 350, disposed between a second contact 360, and the third contact 340.

Figure 3B:
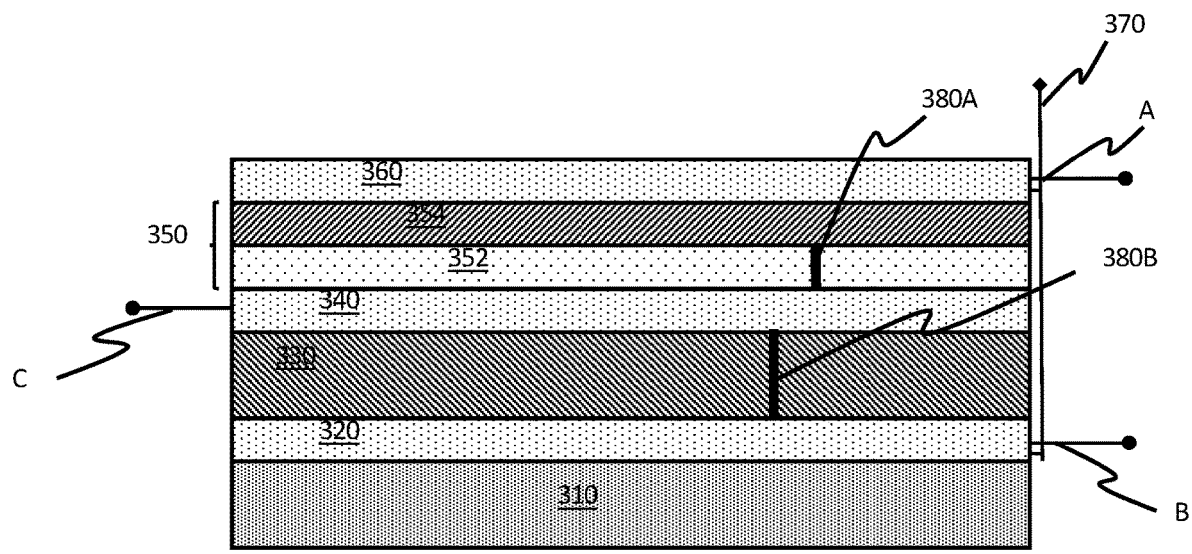
FIG. 3B provides a cross-sectional view of an embodiment of the invention.
Figure 3B:
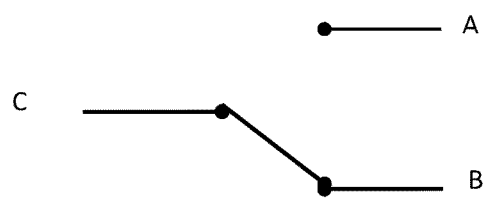

The state of the SPDT switch may be set by the application of a programming pulse to each of the first dielectric material 330, and second dielectric material 350. In an embodiment, a positive programming pulse to each of the dielectrics yields a current conducting path through the second dielectric 350, but not the first dielectric 330, illustrated in FIG. 3A. As shown in FIG. 3A, the programming pulse yields a low resistance connection 380A between contacts C and A. Application of a negative programming pulse applied to each of the dielectric materials yields a current conducting path (for example, a filament 380B) through the first dielectric 330, but not the second dielectric 350, illustrated in FIG. 3B. As shown in FIG. 3B, the programming pulse yields a low resistance connection between contacts C and B. In an embodiment, first dielectric 330, comprises a uniform layer of a dielectric, such as a uniform layer of hafnium oxide ($HfO_2$), while the second dielectric 350, comprises a combination of layers, a first layer 352, of hafnium oxide and a second layer 354, of $HfO_x$, having a higher proportion of Hafnium than $HfO_2$. In this embodiment, after programming the solid-state devices function as switches with current following the conductive path formed through either the first dielectric 330, or second dielectric 350, material.

In an embodiment illustrated in FIGS. 3A and 3B, a common contact 370 connects the outputs of first dielectric 330 and second dielectric 350, enabling application of a common programming pulse to each of the two dielectric materials 330, and 350. In programming the switch, application of a negative pulse to third contact 340 yields a conductive path only through the dielectric comprising a combination of $HfO_x$ and $HfO_2$ layers. Application of a positive pulse to third contact 340, yields a conductive path only through the dielectric comprising a uniform layer of $HfO_2$. In use, after programming, the common contact is removed. The programming of the set of switches may be altered through the application of appropriate positive and negative pulses to third contact 340.

Figure 4:
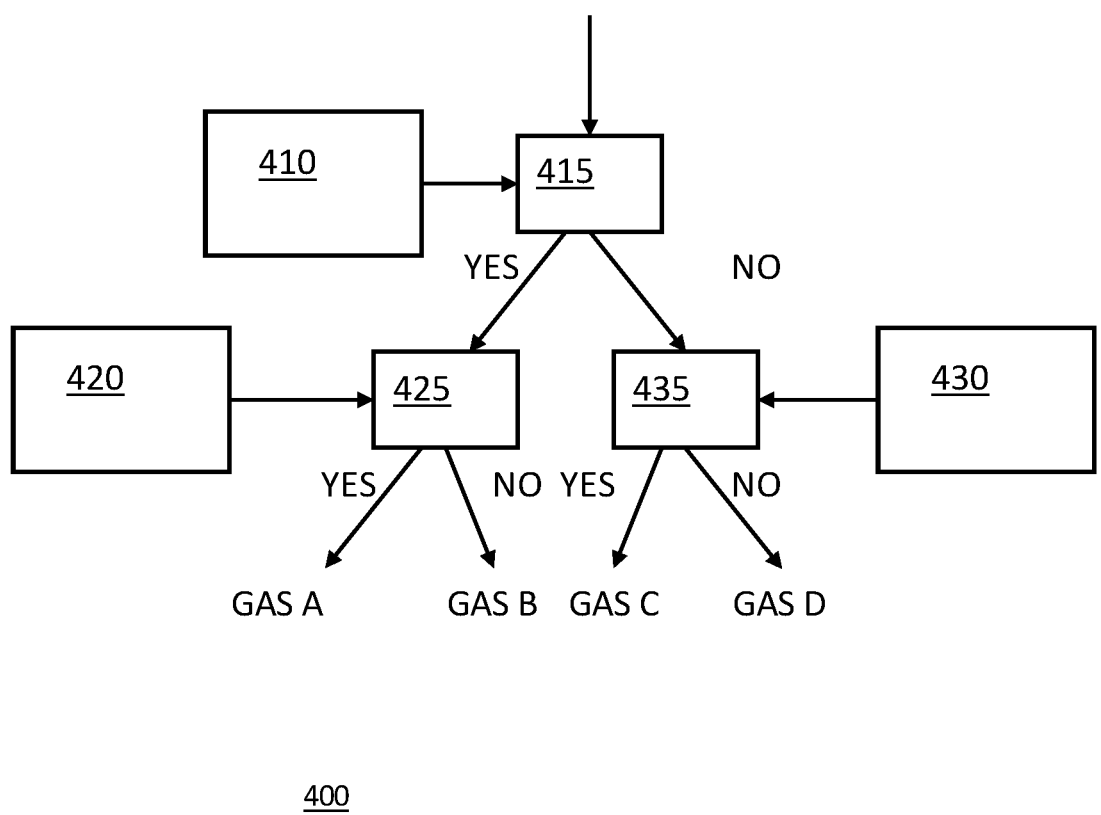
FIG. 4 provides a schematic view of a decision tree embodying a switch according to an embodiment of the invention.

As shown in FIG. 4, a cascade of solid-state switches 400 enables the fabrication of a decision tree enabling a rapid response by programming solid-state switches according to preconfigured inputs. As shown in the Figure, a gas detection system includes three detectors, 410, 420, and 430, the output of each detector determines the state of an associated single solid-state switch, 415, 425, and 435, respectively, as either "yes", associated with a positive output indicating detection, or "no" associated with a negative output indicating a lack of detection. Using the illustrated configuration, the outputs of the three detectors enable the classification or detection of one of four different gases, Gas A, -Gas D, through the use of the three solid-state switches set according to the detector outputs. In an embodiment, unlike a software implementation of a decision tree, the classification using the hardware implementation can complete the desired detection steps in one cycle where the detector(s) output is applied to the solid-state switch(es). The detectors can all work in parallel and provide their output in parallel to the corresponding switches.

In an embodiment, the SET and RESET pulses may be tuned in terms of amplitude and duration to yield switches having proportional outputs, such as 0.2/0.8 corresponding to the relative crystalline and amorphous material resistances rather than traditional 0/1 outputs of a binary SPDT. The use of proportional analog outputs can enable more accurate classification than possible with detectors having only binary output. For example, when a detector have a weak response to some gas, it is not forced to round the output to "no response" (a logical 0).

FIG. 5-13 illustrate fabrication of solid-state switches according to an embodiment of the invention.

Figure 5:
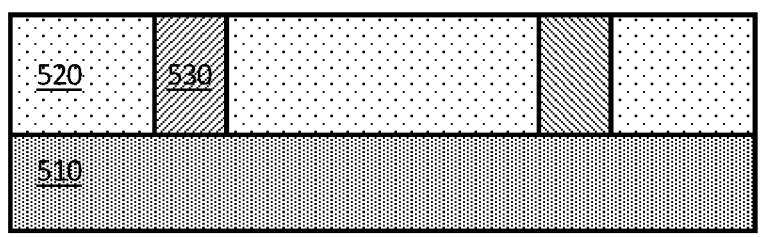
FIG. 5 provides a cross-sectional view of a step in the fabrication of an embodiment of the invention.

FIG. 5 illustrates solid-state device 500 following the formation of bottom heater thermal isolator 520 upon underlying device substrate 510. Substrate 510 may include contact regions for underlying control elements including transistors.

The semiconductor substrate 510 may include any semiconductor material including, for example, silicon. The term "semiconductor material" is used throughout the present application to denote a material that has semiconducting properties. Besides silicon, the semiconductor material may be strained Si, silicon carbide (SiC), germanium (Ge), silicon germanium (SiGe), silicon-germanium-carbon (SiGeC), Si alloys, Ge alloys, III-V semiconductor materials (e.g., gallium arsenide (GaAs), indium arsenide (InAs), indium phosphide (InP), or aluminum arsenide (AlAs)), II-VI materials (e.g., cadmium selenide (CaSe), cadmium sulfide (CaS), cadmium telluride (CaTe), zinc oxide (ZnO), zinc selenide (ZnSe), zinc sulfide (ZnS), or zinc telluride (ZnTe), or any combination thereof. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements. Although not shown, the substrate 110 can include other devices and structures such as transistors, resistors, capacitors, diodes, contacts, isolations, etc.

As shown in the Figure, a layer of a dielectric material 520, such as silicon oxide, carbon-doped silicon oxide, fluorine-doped silicon oxide, porous dielectric material, silicon nitride, etc., is disposed upon substrate 510. Contact vias are etched though the dielectric 520, and bottom electrode material 530, such as tungsten, is deposited in the via in contact with the underlying substrate 510. Chemical mechanical planarization (CMP) of the upper surfaces of the dielectric 520 and bottom electrode follows their formation.

Figure 6:
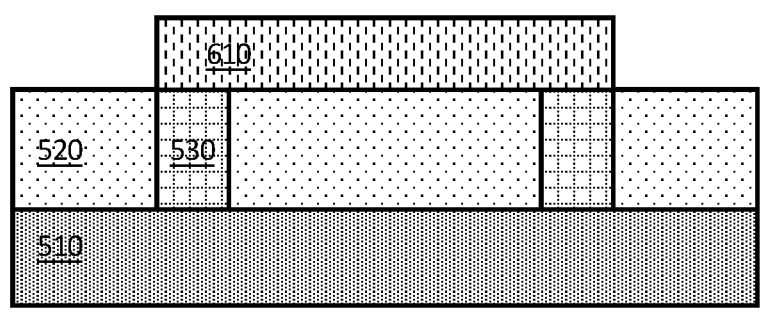
FIG. 6 provides a cross-sectional view of a step in the fabrication of an embodiment of the invention.

FIG. 6 illustrates an embodiment of device 500 following deposition and subsequent patterning and etching of a resistive heater material 610, such as tantalum nitride, amorphous carbon doped with hydrogen, or similar materials.

Figure 7:
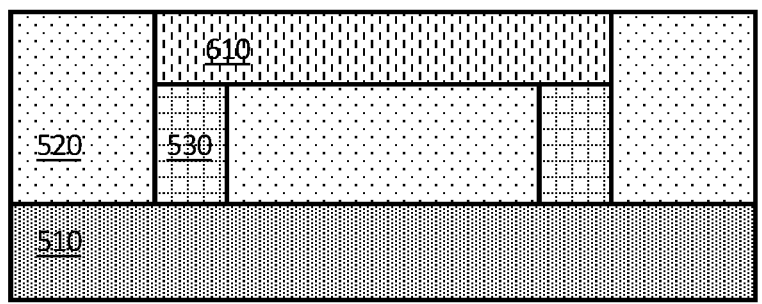
FIG. 7 provides a cross-sectional view of a step in the fabrication of an embodiment of the invention.

FIG. 7 illustrates device 500 following the deposition of additional thermal protective dielectric 520, and CMP to recess the additional dielectric back to the upper surface of the resistive heater material 610.

Figure 8:
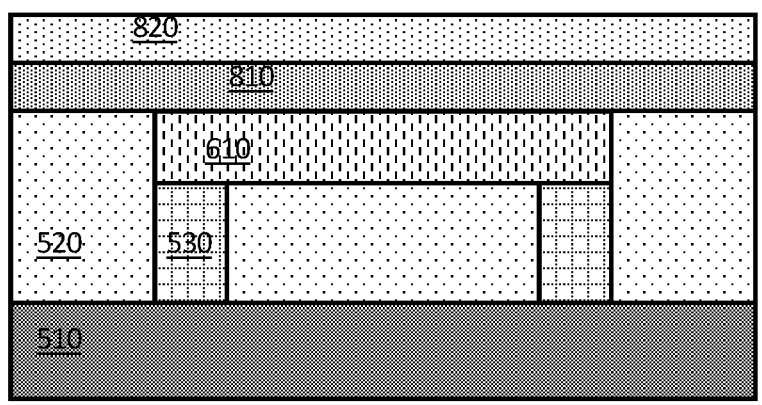
FIG. 8 provides a cross-sectional view of a step in the fabrication of an embodiment of the invention.

FIG. 8 illustrates device 500 following the deposition of a thermally conductive and electrically insulative layer 810, upon dielectric 520 and resistive heater 610. The figure further illustrates the device following deposition of a lower contact layer 820. Exemplary thermally conductive layers include boron nitride, aluminum nitride, and similar materials. Exemplary contact layer materials include tungsten, titanium nitride (TiN) and similar materials.

Figure 9:
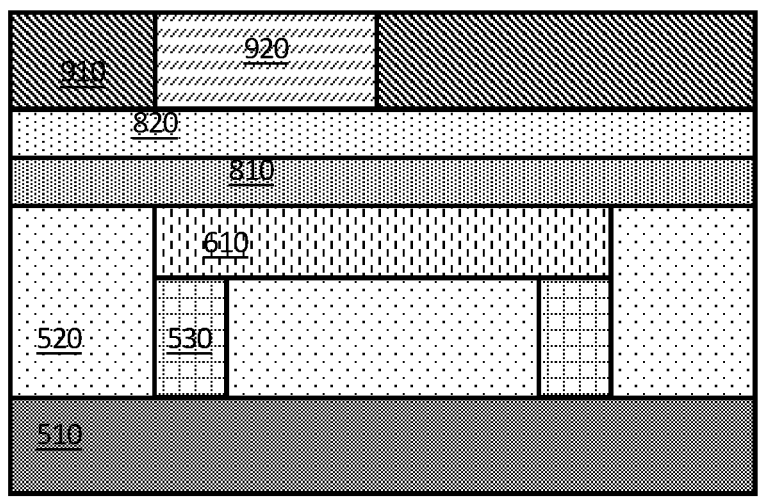
FIG. 9 provides a cross-sectional view of a step in the fabrication of an embodiment of the invention.

FIG. 9 illustrates device 500 following deposition, patterning and etching of first dielectric spacer 910, such as silicon nitride above and adjacent to the lower contact layer. The etching yields a trench for the deposition of a lower Phase Change Material 920, for the switch.

In an embodiment, the first PCM 920, has a high resistance crystalline state and a low resistance amorphous state. The first PCM 920 may be deposited in an amorphous or crystalline state.

Figure 10:
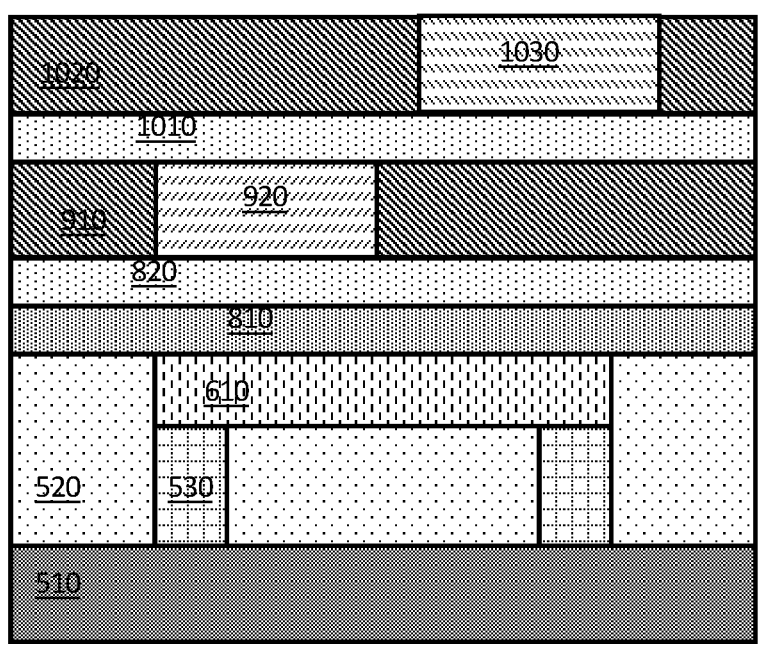
FIG. 10 provides a cross-sectional view of a step in the fabrication of an embodiment of the invention.

FIG. 10 illustrates device 500 following formation of middle conductive contact 1010, such as tungsten or TiN, as well as upper dielectric spacer 1020, such as silicon nitride.

FIG. 10 further illustrates device 500 following patterning an etching of a trench in upper dielectric spacer 1020, as well as deposition of a second PCM 1030, having for example a low resistance crystalline state and a high resistance amorphous state. PCM material 920 and 1030 differ from each other in composition and complement each other in that a first has a low resistance crystalline state while the second has a high resistance crystalline state, the first has a high resistance amorphous state and the second has a low resistance amorphous state.

Figure 11:
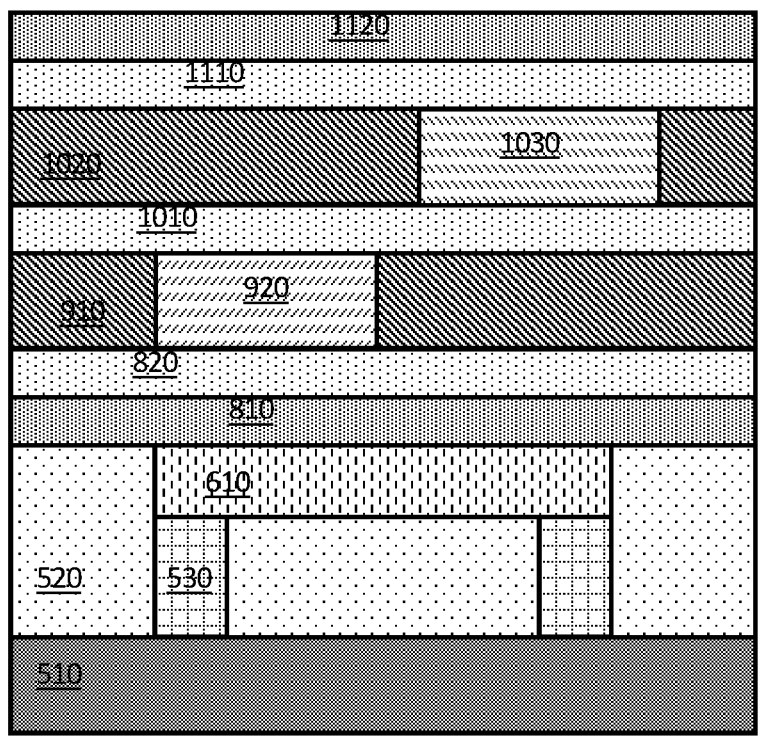
FIG. 11 provides a cross-sectional view of a step in the fabrication of an embodiment of the invention.

FIG. 11 illustrates device 500 following the deposition of an upper contact layer 1110, upon upper dielectric spacer 1020. The figure further illustrates the device following deposition of a thermally conductive and electrically insulative layer 1120 above and adjacent to the upper contact layer 1110. Exemplary thermally conductive layers include boron nitride, aluminum nitride, and similar materials. Exemplary contact layer materials include tungsten, TiN, and similar materials.

Figure 12:
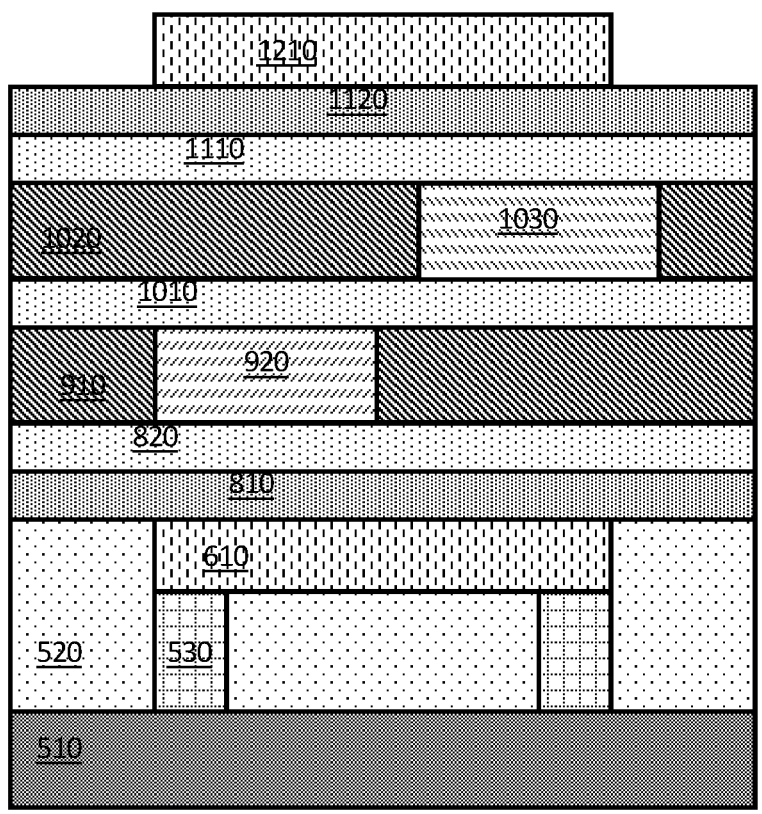
FIG. 12 provides a cross-sectional view of a step in the fabrication of an embodiment of the invention.

FIG. 12 illustrates an embodiment of device 500 following deposition and subsequent patterning and etching of a resistive heater material 1210, such as tantalum nitride, amorphous carbon doped with hydrogen, or similar materials, upon the thermally conductive and electrically insulative layer 1120.

Figure 13:
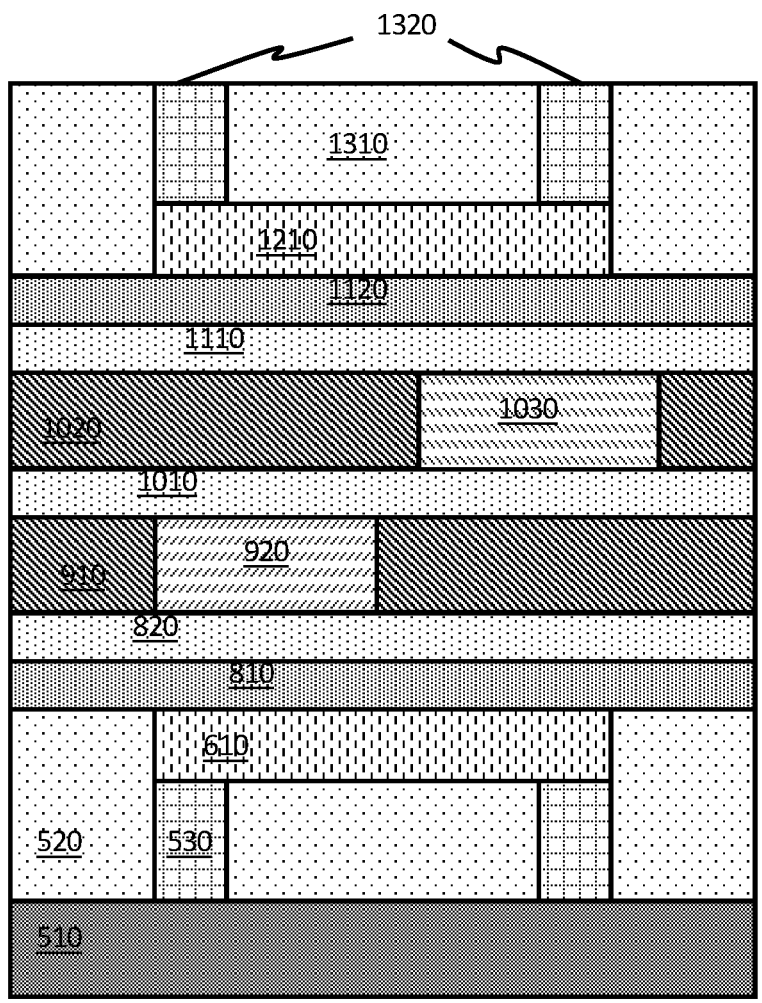
FIG. 13 provides a cross-sectional view of a step in the fabrication of an embodiment of the invention.

FIG. 13, illustrates device 500 following deposition of a thermally insulative layer of a dielectric material 1310, such as silicon oxide, carbon-doped silicon oxide, fluorine-doped silicon oxide, porous dielectric material, silicon nitride, etc., is disposed upon upper heater 1210 and thermally insulative material 1120. Contact vias are etched though the dielectric 1310, and top electrode material 1320, such as tungsten, is deposited in the vias in contact with the heater element 1210. Chemical mechanical planarization (CMP) of the upper surfaces of the dielectric 1310 and top electrodes 1320 follows their formation.

Circuit contacts for the lower 820, middle 1010, and upper 1110, conductive contacts are not shown to simplify the illustrations.

In an embodiment, the phase change materials can include a Ge—Sb—Te (germanium-antimony-tellurium or "GST") alloy. Alternatively, other suitable materials for the phase change material include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, and combinations thereof. In some embodiments, the phase change material can further include nitrogen, carbon, and/or oxygen. In some embodiments, the phase change material can be doped with dielectric materials including but not limited to aluminum oxide ($Al_2O_3$), silicon oxide ($SiO_2$), (tantalum oxide ($Ta_2O_5$), hafnium oxide ($HfO_2$), zirconium oxide ($ZrO_2$), cerium oxide ($CeO_2$), silicon nitride (SiN), silicon oxynitride (SiON), etc.

Figure 14:
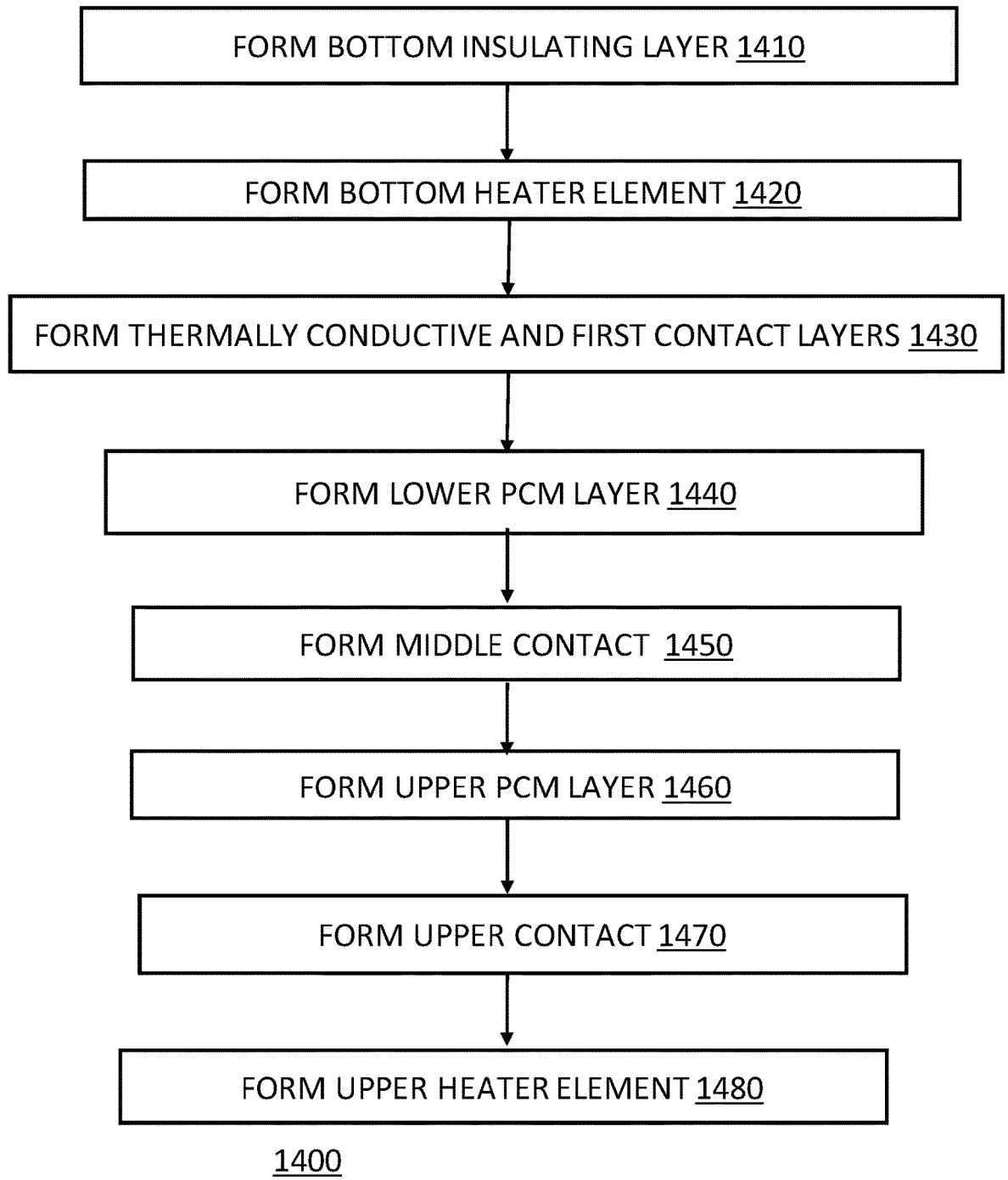
FIG. 14 provides a flowchart of operational steps associated with the fabrication of an embodiment of the invention.

Flowchart 1400, of FIG. 14 lists operational steps in the formation of disclosed structures. At block 1410, formation of a bottom thermally insulative layer upon an underlying substrate occurs. The fabrication method includes deposition of a dielectric layer upon the substrate, selective etching of bottom electrode vias in the dielectric layer, and deposition of the bottom electrode material in the via. In an embodiment, the bottom electrode constitutes a single layer of material, such as tungsten.

At block 1420, the method forms a first resistive heater element upon the bottom dielectric layer. The resistive heater includes a material such as tantalum nitride or a hydrogen doped amorphous carbon deposited in contact with the bottom electrodes. After deposition the resistive heater element layer is patterned and selectively etched to yield the desired resistive heater element pattern. After patterning the resistive heater element, deposition and CMP of additional dielectric material completes the formation of the heater element.

At block 1430, the method disposes a combination of a thermally conductive and electrically insulative layer, such as aluminum nitride or boron nitride, and an electrically conductive layer, such as tungsten, for the lower contact of the solid-state switch.

At block 1440, the method forms a lower dielectric spacer layer from a material such as silicon nitride. The spacer layer is subsequently etched to form a trench for the lower PCM. Deposition of the lower PCM in the trench follows the etching.

At block 1450, the method forms a middle switch contact from a conductive layer such as tungsten, followed by deposition and selective etching of an upper dielectric spacer layer.

At block 1460, deposition of an upper PCM in the trench of the upper dielectric spacer layer occurs. The upper PCM differs from the lower PCM. The upper and lower PCM complement each other in terms of electrical resistivity. The first has a low resistivity in a crystalline state while the second has a high resistivity in the crystalline state. The first has a high resistivity in the amorphous state while the second has a low resistivity amorphous state.

At block 1470, the method deposits a layer of a conductive material such as tungsten, forming the upper switch contact.

At block 1480, the method forms the upper resistive heater. The method deposits an electrically insulative and thermally conductive layer upon the upper switch contact, followed by the deposition and selective patterning and etching of an upper resistive heater layer and an upper thermal insulative layer, through which upper heater contacts vias and upper heater contacts are formed.

In an embodiment, fabrication of the switch proceeds from the substrate with deposition of a lower conductive contact layer upon the underlying substrate followed by deposition of a first dielectric layer, such as a uniform layer of $HfO_2$, upon the lower contact layer. A middle conductive contact layer is disposed above and in contact with the first dielectric layer, followed by the successive deposition of two dielectric layers, such as a first layer of $HfO_2$ in contact with the middle contact layer, and an upper dielectric layer such as $HfO_x$, where x<2. Deposition of an upper conductive layer, such as tungsten, follows the dielectric layers. In this embodiment, application of a negative electrical pulse between the middle and upper as well as the middle and lower device contacts yield a switch having a current path between the middle and upper contacts. Conversely, application of a positive electrical pulse between the middle and upper as well as the middle and lower device contacts yields a switch having a current path between the middle contact and the lower contact.

Subsequent to the described fabrication steps, addition fabrication may occur to add additional circuitry and/or packaging to the devices.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A solid-state switch structure comprising:
   a first solid-state material having a programable electrical resistance comprising a high electrical resistance obtained following a first type programming pulse and a low electrical resistance obtained following a second type programming pulse;
   a second solid-state material having a programable electrical resistance comprising a high electrical resistance obtained following said second type programming pulse and a low electrical resistance obtained following said first type programming pulse;
   a first contact made to a first end of said first solid-state material;
   a second contact made to a first end of said second solid-state material; and
   a third contact made to a second end of said first solid-state material and to a second end of said second solid-state material.

2. The solid-state switch structure according to claim 1, wherein the first solid-state material comprises a first phase change material and the second solid-state material comprises a second phase change material.

3. The solid-state switch structure according to claim 1, wherein the first solid-state material comprises a first dielectric material and the second solid-state material comprises a second dielectric material.

4. The solid-state switch structure according to claim 1, further comprising a resistive heater element disposed adjacent to the first solid-state material.

5. The solid-state switch structure according to claim 1, wherein the first solid-state material is disposed in a layer of dielectric material.

6. The solid-state switch structure according to claim 1, wherein the first solid-state material is disposed adjacent to a first portion of the third contact, the second solid-state material is disposed adjacent to a second portion of the third contact, and the first portion and second portions of the third contact, do not overlap.

7. The solid-state switch according to claim 1, wherein a crystalline state of the first solid-state material and a crystalline state of the second solid-state material form a low resistance connection between the third contact and the second contact.

8. The solid-state switch according to claim 1, wherein an amorphous state of the first solid-state material and an amorphous state of the second solid-state material form a low resistance connection between the third contact and the first contact.

9. A solid-state single pole double throw switch comprising:
   a first phase change material having a high resistance crystalline state and a low resistance amorphous state;
   a second phase change material having a high resistance amorphous state and a low resistance crystalline state;
   a first contact made to a first end of the first phase change material;
   a second contact made to a first end of said second phase change material; and a third contact made to a second end of said first phase change material and to a second end of the second phase change material.

10. The solid-state switch structure according to claim 9, further comprising a resistive heater element disposed adjacent to first phase change material.

11. The solid-state switch according to claim 9, wherein the first phase change material is disposed in a layer of dielectric material.

12. The solid-state switch according to claim 9, wherein the crystalline state of the first phase change material and the crystalline state of the second phase change material form a low resistance connection between the third contact and the second contact.

13. The solid-state switch according to claim 9, wherein the amorphous state of the first phase change material and the amorphous state of the second phase change material form a low resistance connection between the third contact and the first contact.

14. The solid-state switch structure according to claim 10, wherein first phase change material is disposed adjacent to a first portion of the third contact, the second phase change material is disposed adjacent to a second portion of the third contact, and the first portion and second portions of the third contact, do not overlap.

15. A decision tree comprising a first solid-state switch connected in series with a second solid-state switch, at least one of the first and second solid-state switches comprising:
   a first solid-state material having a programable electrical resistance comprising a high electrical resistance obtained following a first type programming pulse and a low electrical resistance obtained following a second type programming pulse;
   a second solid-state material having a programable electrical resistance comprising a high electrical resistance obtained following said second type programming pulse and a low electrical resistance obtained following said first type programming pulse;
   a first contact made to a first end of said first solid-state material;
   a second contact made to a first end of said second solid-state material; and
   a third contact made to a second end of said first solid-state material and to a second end of said second solid-state material.

16. The decision tree according to claim 15, wherein the first solid-state material comprises a first phase change material and the second solid-state material comprises a second phase change material.

17. The decision tree according to claim 15, wherein the first solid-state material comprises a first dielectric material and the second solid-state material comprises a second dielectric material.

18. The decision tree according to claim 15, further comprising a resistive heater element disposed adjacent to the first solid-state material.

19. The decision tree according to claim 15, wherein a crystalline state of the first solid-state material and a crystalline state of the second solid-state material form a low resistance connection between the third contact and the second contact.

20. The decision tree according to claim 15, wherein an amorphous state of the first solid-state material and an amorphous state of the second solid-state material form a low resistance connection between the third contact and the first contact.

* * * * *